United States Patent
Lu et al.

(10) Patent No.: US 12,101,952 B2
(45) Date of Patent: Sep. 24, 2024

(54) LIGHT-EMITTING SUBSTRATE AND METHOD FOR MANUFACTURING THE SAME, AND LIGHT-EMITTING APPARATUS

(71) Applicant: BOE TECHNOLOGY GROUP CO., LTD., Beijing (CN)

(72) Inventors: Zhigao Lu, Beijing (CN); Yichi Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 497 days.

(21) Appl. No.: 17/611,930

(22) PCT Filed: Oct. 28, 2020

(86) PCT No.: PCT/CN2020/124472
§ 371 (c)(1),
(2) Date: Nov. 17, 2021

(87) PCT Pub. No.: WO2022/087903
PCT Pub. Date: May 5, 2022

(65) Prior Publication Data
US 2022/0310957 A1     Sep. 29, 2022

(51) Int. Cl.
*H10K 50/11*     (2023.01)
*H10K 50/115*   (2023.01)
(Continued)

(52) U.S. Cl.
CPC .......... *H10K 50/11* (2023.02); *H10K 50/115* (2023.02); *H10K 59/122* (2023.02); *H10K 71/00* (2023.02);
(Continued)

(58) Field of Classification Search
CPC .... H10K 50/11; H10K 50/115; H10K 59/122; H10K 71/00; H10K 59/1201;
(Continued)

(56) References Cited

U.S. PATENT DOCUMENTS

2008/0135856 A1* 6/2008 Moon ..................... H01L 33/22
                                                                257/E33.068
2010/0038643 A1   2/2010 Park et al.
(Continued)

FOREIGN PATENT DOCUMENTS

CN    106601774    4/2017
CN    106601922    4/2017

OTHER PUBLICATIONS

PCT International Search Report (w/ English translation) and Written Opinion for corresponding Application No. PCT/CN2020/124472, mailed on Jul. 28, 2021, 8 pages.

*Primary Examiner* — Kevin Quarterman
(74) *Attorney, Agent, or Firm* — Dority & Manning, P.A.

(57) ABSTRACT

A light-emitting substrate includes a base; a first material layer and a second material layer that are disposed on the base, and an etch stop layer between the first material layer and the second material layer. The first material layer is closer to the base than the second material layer. The second material layer includes a plurality of patterns, and each pattern and the first material layer have an overlapping region therebetween. The etch stop layer includes at least portions in respective overlapping regions. A portion of the etch stop layer located in each overlapping region is in contact with the first material layer and the second material layer. Energy level(s) of the portion of the etch stop layer located in each overlapping region are matched with energy levels of the first material layer and the second material layer at corresponding positions.

20 Claims, 8 Drawing Sheets

(51) Int. Cl.
H10K 59/122 (2023.01)
H10K 71/00 (2023.01)
*H10K 59/12* (2023.01)
*H10K 101/30* (2023.01)
*H10K 101/40* (2023.01)
*H10K 102/00* (2023.01)

(52) U.S. Cl.
CPC ..... *H10K 59/1201* (2023.02); *H10K 2101/30* (2023.02); *H10K 2101/40* (2023.02); *H10K 2102/351* (2023.02)

(58) Field of Classification Search
CPC ........... H10K 2101/30; H10K 2101/40; H10K 2102/351; H10K 2102/321; H10K 71/231; H10K 59/35; H01L 21/82
See application file for complete search history.

(56) References Cited

U.S. PATENT DOCUMENTS

| | | |
|---|---|---|
| 2011/0017989 A1 | 1/2011 | Chen et al. |
| 2011/0101321 A1 | 5/2011 | Choi |
| 2017/0352718 A1 | 12/2017 | Kim et al. |
| 2018/0040843 A1 | 2/2018 | Lee et al. |
| 2020/0212131 A1* | 7/2020 | Kim ...................... H10K 59/126 |
| 2020/0266249 A1* | 8/2020 | Cho ....................... H01L 25/167 |
| 2021/0050395 A1* | 2/2021 | Okabe ................. H10K 71/231 |
| 2021/0175457 A1* | 6/2021 | Park ....................... H10K 59/38 |

\* cited by examiner

LIGHT-EMITTING SUBSTRATE AND METHOD FOR MANUFACTURING THE SAME, AND LIGHT-EMITTING APPARATUS

CROSS-REFERENCE TO RELATED APPLICATION

This application is a national phase entry under 35 USC 371 of International Patent Application No. PCT/CN2020/124472 filed on Oct. 28, 2020, which is incorporated herein by reference in its entirety.

TECHNICAL FIELD

The present disclosure relates to technical fields of lighting and display, and in particular, to a light-emitting substrate and a method for manufacturing the same, and a light-emitting apparatus.

BACKGROUND

Compared with organic light-emitting diode (OLED) light-emitting devices, quantum dot light-emitting diode (QLED) light-emitting devices have advantages of higher theoretical luminous efficiency, adjustable color, wider color gamut, better color saturation and vividness, lower energy consumption cost, etc.

SUMMARY

In one aspect, a light-emitting substrate is provided, including: a base; a first material layer and a second material layer that are disposed on the base, the first material layer being closer to the base than the second material layer, a material of the first material layer including a conductive material or a carrier transport material, the second material layer including a plurality of patterns, and each pattern and the first material layer having an overlapping region therebetween; and an etch stop layer between the first material layer and the second material layer, the etch stop layer including at least portions in respective overlapping regions, a portion of the etch stop layer located in each overlapping region being in contact with the first material layer and the second material layer, and a material of the etch stop layer including at least one of metal material, metal oxide and metal fluoride. Energy level(s) of a portion of the etch stop layer located in each overlapping region are matched with energy levels of the first material layer and the second material layer at the corresponding positions.

In some embodiments, the light-emitting substrate further includes a pixel defining layer disposed on the base. The pixel defining layer defines a plurality of openings, each pattern is in an opening, and the etch stop layer includes at least portions in respective openings.

In some embodiments, the etch stop layer further includes a portion outside respective openings, and a thickness of a portion of the etch stop layer located in each opening is less than or equal to a thickness of the portion of the etch stop layer located outside the respective openings.

In some embodiments, the portion of the etch stop layer located in each opening has a single-layer structure or a double-layer structure. In a case where the portion of the etch stop layer located in each opening has a single-layer structure, a material of the portion of the etch stop layer located in each opening is the same as a material of the portion of the etch stop layer located outside the respective openings, each including at least one of aluminum oxide, silver oxide, molybdenum oxide and lithium fluoride. In a case where the portion of the etch stop layer located in each opening has a double-layer structure, the portion of the etch stop layer located in each opening includes a metal layer and a metal oxide layer that are sequentially arranged in a direction away from the base. A material of the metal layer includes metallic aluminum and/or metallic silver, and a material of the metal oxide layer includes an oxide of metallic aluminum and/or an oxide of metallic silver, and a material of the portion of the etch stop layer located outside the respective openings is the same as the material of the metal layer.

In some embodiments, a difference between the thickness of the portion of the etch stop layer located outside the respective openings and the thickness of the portion of the etch stop layer located in each opening is less than 5 nm.

In some embodiments, the thickness of the portion of the etch stop layer located outside the respective openings is in a range from 0.5 nm to 50 nm.

In some embodiments, the first material layer is an electron transport layer, and the second material layer is a quantum dot light-emitting layer; or the first material layer is a cathode layer, and the second material layer is an electron transport layer.

In some embodiments, in a case where the first material layer is a cathode layer, the second material layer is an electron transport layer and the etch stop layer has a single-layer structure, an absolute value of a difference between a lowest unoccupied molecular orbital (LUMO) energy level of the portion of the etch stop layer located in each opening and a Fermi level of the first material layer at a corresponding position, and an absolute value of a difference between the LUMO energy level of the portion of the etch stop layer located in each opening and a LUMO energy level of the second material layer at a corresponding position, are both less than 0.15 eV. In a case where the first material layer is a cathode layer, the second material layer is an electron transport layer and the etch stop layer has a double-layer structure, the portion of the etch stop layer located in each opening includes a first surface adjacent to the first material layer and a second surface adjacent to the second material layer and an absolute value of a difference between a LUMO energy level of the first surface and the Fermi level of the first material layer at a corresponding position, and an absolute value of a difference between a LUMO energy level of the second surface and the LUMO energy level of the second material layer at a corresponding position, are both less than 0.15 eV.

In some embodiments, in a case where the first material layer is an electron transport layer, the second material layer is a quantum dot light-emitting layer and the etch stop layer has a single-layer structure, an absolute value of a difference between a LUMO energy level of the portion of the etch stop layer located in each opening and a LUMO energy level of the first material layer at a corresponding position, and an absolute value of a difference between the LUMO energy level of the portion of the etch stop layer located in each opening and a LUMO energy level of the second material layer at a corresponding position, are both less than 0.15 eV. In a case where the first material layer is an electron transport layer, the second material layer is a quantum dot light-emitting layer and the etch stop layer has a double-layer structure, the portion of the etch stop layer located in each opening includes a first surface adjacent to the first material layer and a second surface adjacent to the second material layer; and an absolute value of a difference between a LUMO energy level of the first surface and a a LUMO energy level of the first material layer at a corresponding position, and an absolute value of a difference between a LUMO energy level of the second surface and the LUMO energy level of the second material layer at a corresponding position, are both less than 0.15 eV.

In some embodiments, the light-emitting layer includes i different types of light-emitting patterns, and i is an integer greater than or equal to 2.

In some embodiments, the plurality of openings include i opening groups, and each opening group corresponds to light-emitting patterns of a respective type. Thicknesses of portions of the etch stop layer located in a j-th opening group are the same as thicknesses of portions of the etch stop layer located in a k-th opening group; j and k are each any one of 1 to i, and values of j and k are different.

In some embodiments, in a case where the first material layer is a cathode layer, the light-emitting substrate further includes an anode layer at a side of the first material layer away from the base, a quantum dot light-emitting layer between the anode layer and the second material layer, and a hole transport layer between the quantum dot light-emitting layer and the anode layer. In a case where the first material layer is an electron transport layer, the light-emitting substrate further includes an anode layer at a side of the first material layer away from the base, and a hole transport layer between the anode layer and the second material layer.

In another aspect, a light-emitting substrate is provided, including: a base; a first material layer and a second material layer that are disposed on the base, the first material layer being closer to the base than the second material layer, a material of the first material layer including a conductive material or a carrier transport material, the second material layer being a patterned material layer including a plurality of patterns, and each pattern and the first material layer having an overlapping region therebetween; and a third material layer between the first material layer and the second material layer, the third material layer including at least portions in respective overlapping regions, a portion of the third material layer located in each overlapping region being in contact with the first material layer and the second material layer at corresponding positions, the third material layer having a double-layer structure including a metal layer and a metal oxide layer, a material of the metal layer including metallic aluminum and/or metallic silver, and a material of the metal oxide layer including an oxide of metallic aluminum and/or an oxide of metallic silver.

In yet another aspect, a light-emitting apparatus is provided, including the light-emitting substrate as described above.

In yet another aspect, a method for manufacturing a light-emitting substrate is provided. The method includes:

forming a first material layer, an etch stop layer and a second material layer sequentially on a base. A material of the first material layer includes a conductive material or a carrier transport material, the second material layer is a patterned material layer including a plurality of patterns, and each pattern and the first material layer have an overlapping region therebetween. The etch stop layer includes at least portions in respective overlapping regions, a portion of the etch stop layer located in each overlapping region is in contact with the first material layer and the second material layer at corresponding positions, and a material of the etch stop layer includes at least one of metal material, metal oxide and metal fluoride; and energy level(s) of the portion of the etch stop layer located in each overlapping region are matched with energy levels of the first material layer and the second material layer at corresponding positions.

In some embodiments, the second material layer includes one or i types of patterns, and i is an integer greater than or equal to 2. Forming the first material layer, the etch stop layer and the second material layer sequentially on the base, includes:

forming the first material layer and a first thin film sequentially on the base, a material of the first thin film including at least one of metallic aluminum and metallic silver, or the material of the first thin film including at least one of aluminum oxide, silver oxide, molybdenum oxide and lithium fluoride; forming a j-th sacrificial layer and a j-th photoresist layer sequentially on the base where the first material layer and the first thin film have been formed; forming a j-th photoresist pattern layer through exposure and development to expose portions of the j-th sacrificial layer located in a j-th region; bombarding the portions of the j-th sacrificial layer located in the j-th region by using a plasma to remove the portions of the j-th sacrificial layer located in the j-th region; forming a second thin film on the base where the portions of the j-th sacrificial layer located in the j-th region have been removed, the second thin film including portions in the j-th region and a portion on a surface of the j-th photoresist pattern layer away from the base; and removing a portion of the j-th sacrificial layer located outside the j-th region, together with the j-th photoresist pattern layer on the j-th sacrificial layer and a portion of the second thin film located on the surface of the j-th photoresist pattern layer away from the base. In a case where the second material layer includes a type of pattern, j is equal to 1; and in a case where the second material layer includes i types of patterns, j is each of 1 to i.

In some embodiments, in a case where a material of the first thin film includes metallic aluminum and/or metallic silver, a working gas used in the plasma is an oxygen-containing gas, so as to form an oxide layer of metallic aluminum and/or an oxide layer of metallic silver on a surface of the first thin film located in the j-th region after removing the portions of the j-th sacrificial layer located in the j-th region.

In some embodiments, a working gas used in the plasma includes at least one of oxygen and argon.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products, actual processes of methods and actual timings of signals to which the embodiments of the present disclosure relate.

DETAILED DESCRIPTION

Figure 1:
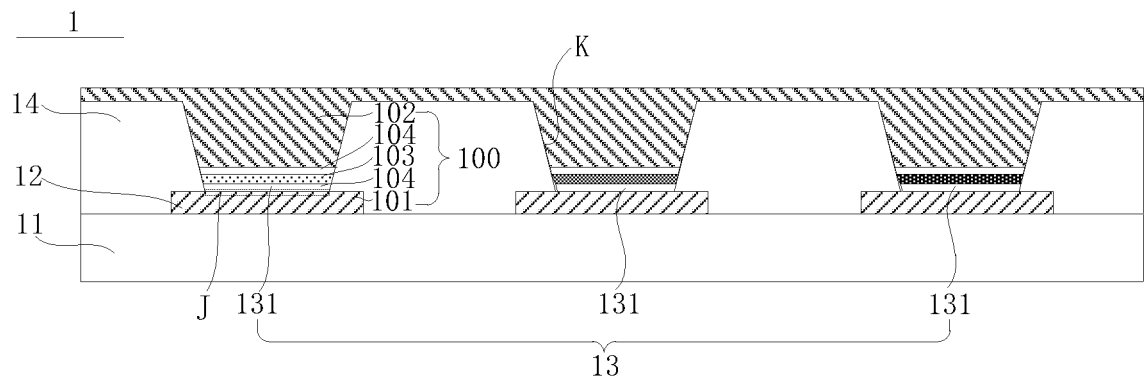
FIG. 1 is a cross-sectional structural view of a light-emitting substrate, in accordance with some embodiments.

The technical solutions in some embodiments of the present disclosure will be described clearly and completely below with reference to accompanying drawings. However, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, terms such as "first" and "second" are only used for descriptive purposes, and are not to be construed as indicating or implying relative importance or implicitly indicating the number of indicated technical features. Thus, features defined by "first" or "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

Use of the phrase "applicable to" or "configured to" is meant an open and inclusive expression, which does not exclude devices that are applicable to or configured to perform additional tasks or steps.

In addition, the use of the phase "based on" is meant to be open and inclusive, since a process, step, calculation or other action that is "based on" one or more of the stated conditions or values may, in practice, be based on additional conditions or values exceeding those stated.

As used herein, the term "about" or "approximately" includes a stated value and an average value within an acceptable range of deviation of a particular value. The acceptable range of deviation is determined by a person of ordinary skill in the art in view of measurement in question and the error associated with the measurement of a particular quantity (i.e., the limitations of the measurement system).

Exemplary embodiments are described herein with reference to sectional views and/or plan views as idealized exemplary drawings. In the accompanying drawings, thicknesses of layers and regions are enlarged for clarity. Therefore, variations in shape with respect to the drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of the region in a device, and are not intended to limit the scope of the exemplary embodiments.

Some embodiments of the present disclosure provide a light-emitting apparatus. The light-emitting apparatus includes a light-emitting substrate, and may, of course, further include other components, such as a circuit for providing electrical signals to the light-emitting substrate to drive the light-emitting substrate to emit light, which may be referred to as a control circuit. The circuit may include a circuit board electrically connected to the light-emitting substrate and/or an integrated circuit (IC) electrically connected to the light-emitting substrate.

In some embodiments, the light-emitting apparatus may be a lighting apparatus. In this case, the light-emitting apparatus serves as a light source to perform a lighting function. For example, the light-emitting apparatus may be a backlight module in a liquid crystal display apparatus, a lamp for internal or external lighting, or a signal lamp.

In some other embodiments, the light-emitting apparatus may be a display apparatus for displaying images (i.e., pictures). In this case, the light-emitting apparatus may include a display or a product including a display. The display may be a flat panel display (FPD), a micro display, or the like. If classified according to whether users can see a scene behind a back of the display, the display may be a transparent display or an opaque display. If classified according to whether the display may be bent or rolled, the display may be a flexible display or an ordinary display (which may be referred to as a rigid display). For example, the product including the display may include a computer display, a television, a billboard, a laser printer with a display function, a telephone, a mobile phone, a personal digital assistant (PDA), a laptop computer, a digital camera, a portable camcorder, a viewfinder, a vehicle, a large-area wall, a theater screen, a stadium sign, or the like.

Figure 2:
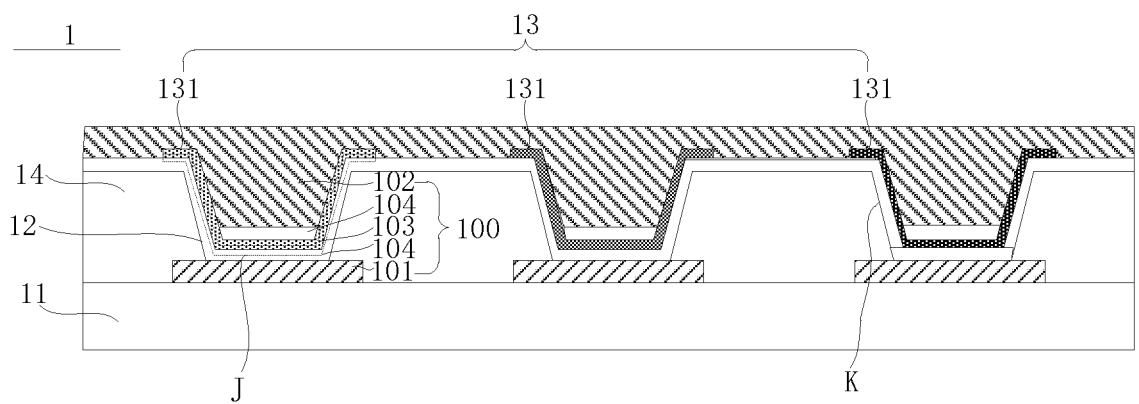
FIG. 2 is a cross-sectional structural view of a light-emitting substrate, in accordance with some other embodiments.

Some embodiments of the present disclosure provide a light-emitting substrate. As shown in FIGS. 1 and 2, the light-emitting substrate 1 includes a base 11, and a first material layer 12 and a second material layer 13 that are disposed on the base 11. The first material layer 12 is closer to the base 11 than the second material layer 13. A material of the first material layer 12 includes a conductive material or a carrier transport material. The second material layer 13 is a patterned material layer including a plurality of patterns 131. There is an overlapping region J between each pattern 131 and the first material layer 12.

Figure 3:
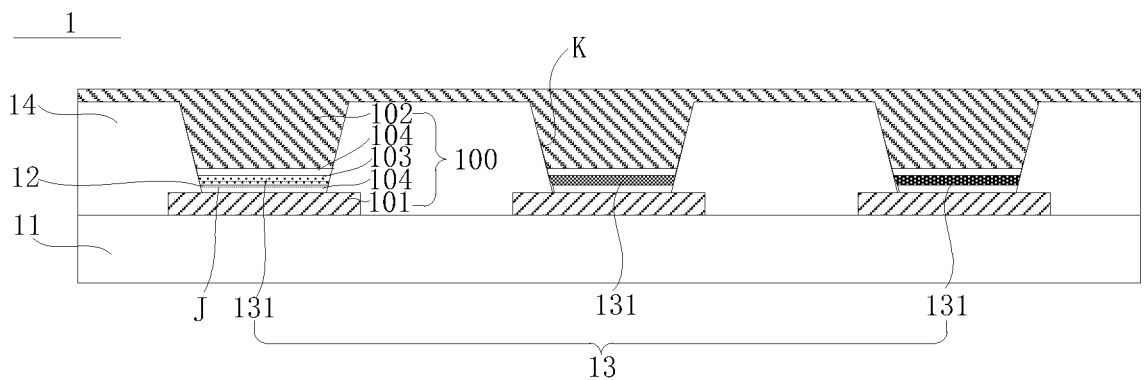
FIG. 3 is a cross-sectional structural view of a light-emitting substrate, in accordance with yet some other embodiments.

According to the fact that the light-emitting substrate 1 includes a plurality of light-emitting devices 100, and each light-emitting device 100 includes a first electrode 101, a second electrode 102, a light-emitting pattern 103 disposed between the first electrode 101 and the second electrode 102, and carrier transport patterns 104 respectively disposed between the light-emitting pattern 103 and the first electrode 101 and between the light-emitting pattern 103 and the second electrode 102, it will be known that, in a first case (a case where the first material layer 12 includes a conductive material), as shown in FIG. 1, the first material layer 12 may be an electrode layer, and in this case, the second material layer 13 may be a patterned carrier transport layer. For example, the first material layer 12 may be a cathode layer, and in this case, the second material layer 13 is a patterned electron transport layer (ETL), and each electron transport pattern is a pattern. In this case, the base 11 may be a base formed with a pixel driving circuit, the first material layer 12 includes a plurality of spaced cathodes, and there is an overlapping region J between each electron transport pattern and a respective cathode. In a second case (a case where the material of the first material layer 12 includes a carrier transport material), as shown in FIG. 2, the first material layer 12 may be an electronic transport layer ETL, and in this case, the second material layer 13 may be a patterned light-emitting layer including a plurality of light-emitting patterns. In this case, the base 11 may be a base formed with a pixel driving circuit, a cathode layer and a pixel defining layer 14. The pixel defining layer 14 defines a plurality of openings K. As shown in FIG. 2, the first material layer 12 may be a whole layer. Alternatively, as shown in FIG. 3, the first material layer 12 only includes portions in respective openings K, and each light-emitting pattern is in an opening K and forms an overlapping region J with a portion of the first material layer 12 in the opening K.

Figure 4:
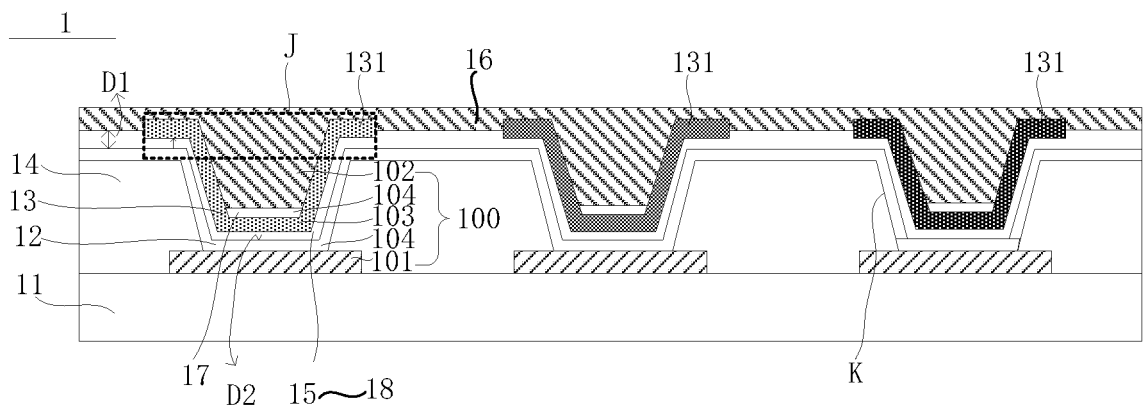
FIG. 4 is a cross-sectional structural view of a light-emitting substrate, in accordance with yet some other embodiments.
Figure 5:
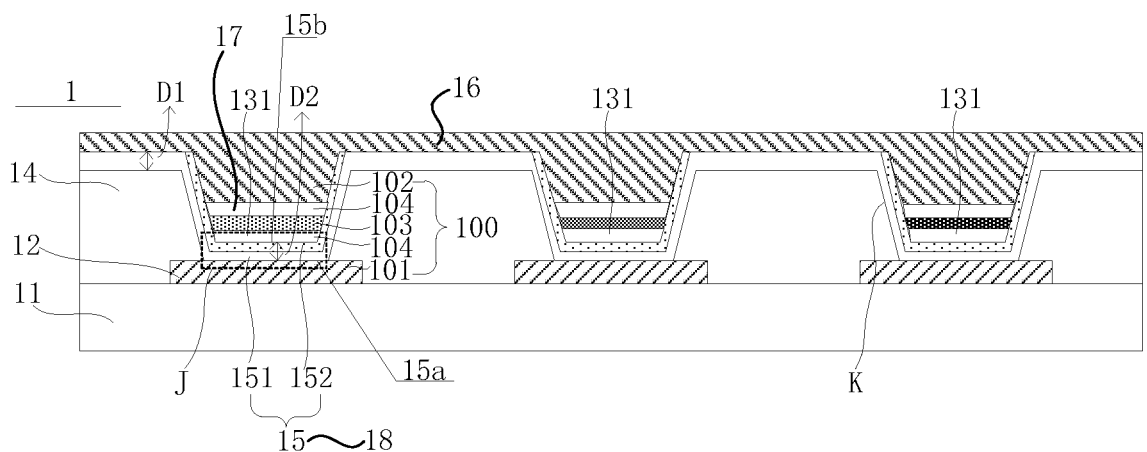
FIG. 5 is a cross-sectional structural view of a light-emitting substrate, in accordance with yet some other embodiments.

In some embodiments, as shown in FIGS. 4 and 5, the light-emitting substrate 1 further includes an etch stop layer 15 between the first material layer 12 and the second material layer 13. The etch stop layer 15 includes at least portions in respective overlapping regions J. A portion of the etch stop layer 15 located in each overlapping region J is in contact with portions of the first material layer 12 and the second material layer 13 at corresponding positions. A material of the etch stop layer 15 includes at least one of metal material, metal oxide and metal fluoride. Energy level(s) of the portion of the etch stop layer 15 located in each overlapping region J are matched with energy levels of the first material layer 12 and the second material layer 13 at corresponding positions.

According to the above two cases, as shown in FIGS. 5 to 8, the light-emitting substrate 1 may further include a pixel defining layer 14 disposed on the base 11. The pixel defining layer 14 defines a plurality of openings K, and each pattern 131 is in an opening K. In this case, the etch stop layer 15 includes at least portions in respective openings K.

Figure 9:
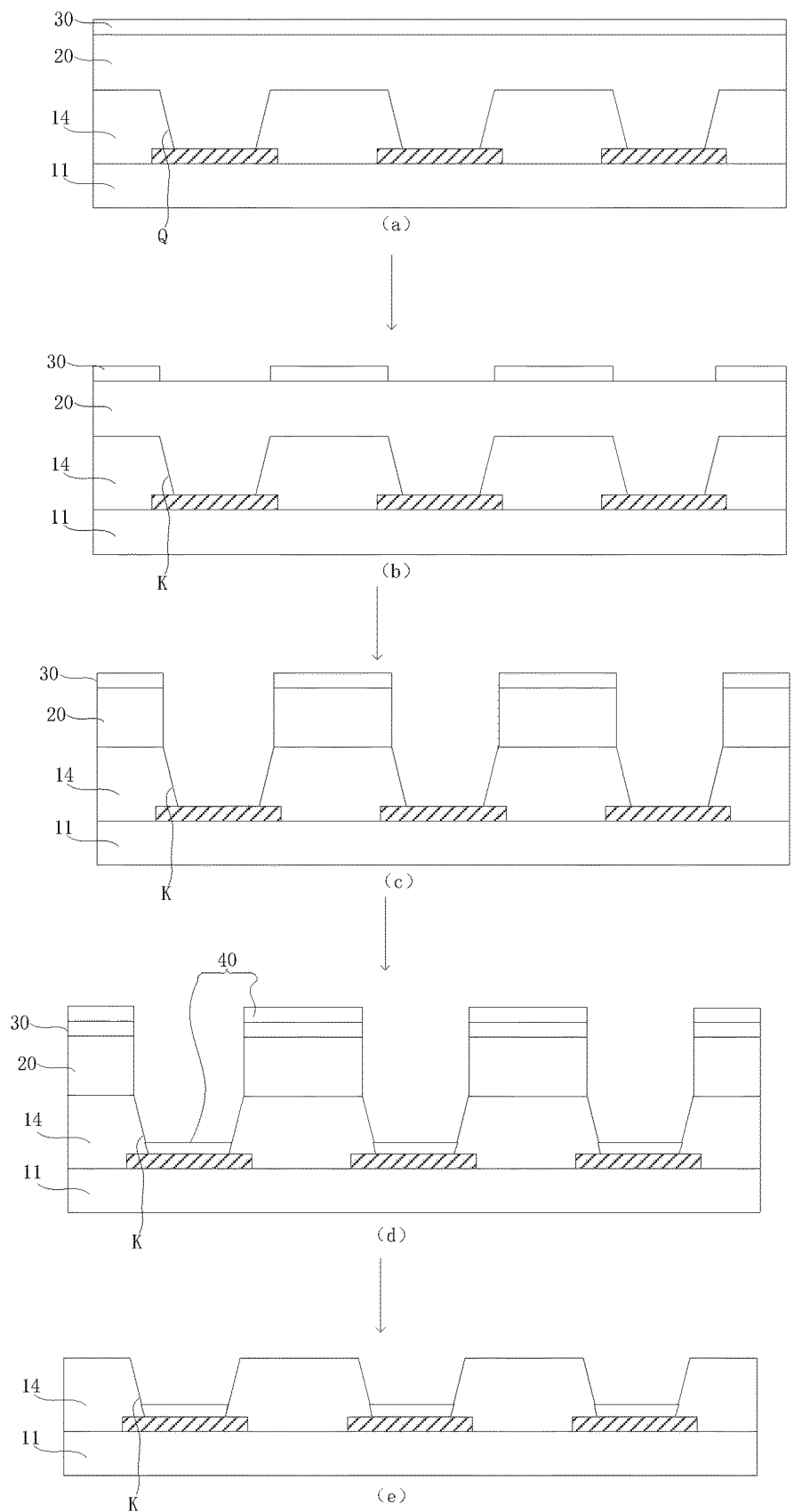
FIG. 9 is a flow chart of forming the patterned electron transport layer shown in FIG. 1, in accordance with some embodiments.
Figure 10:
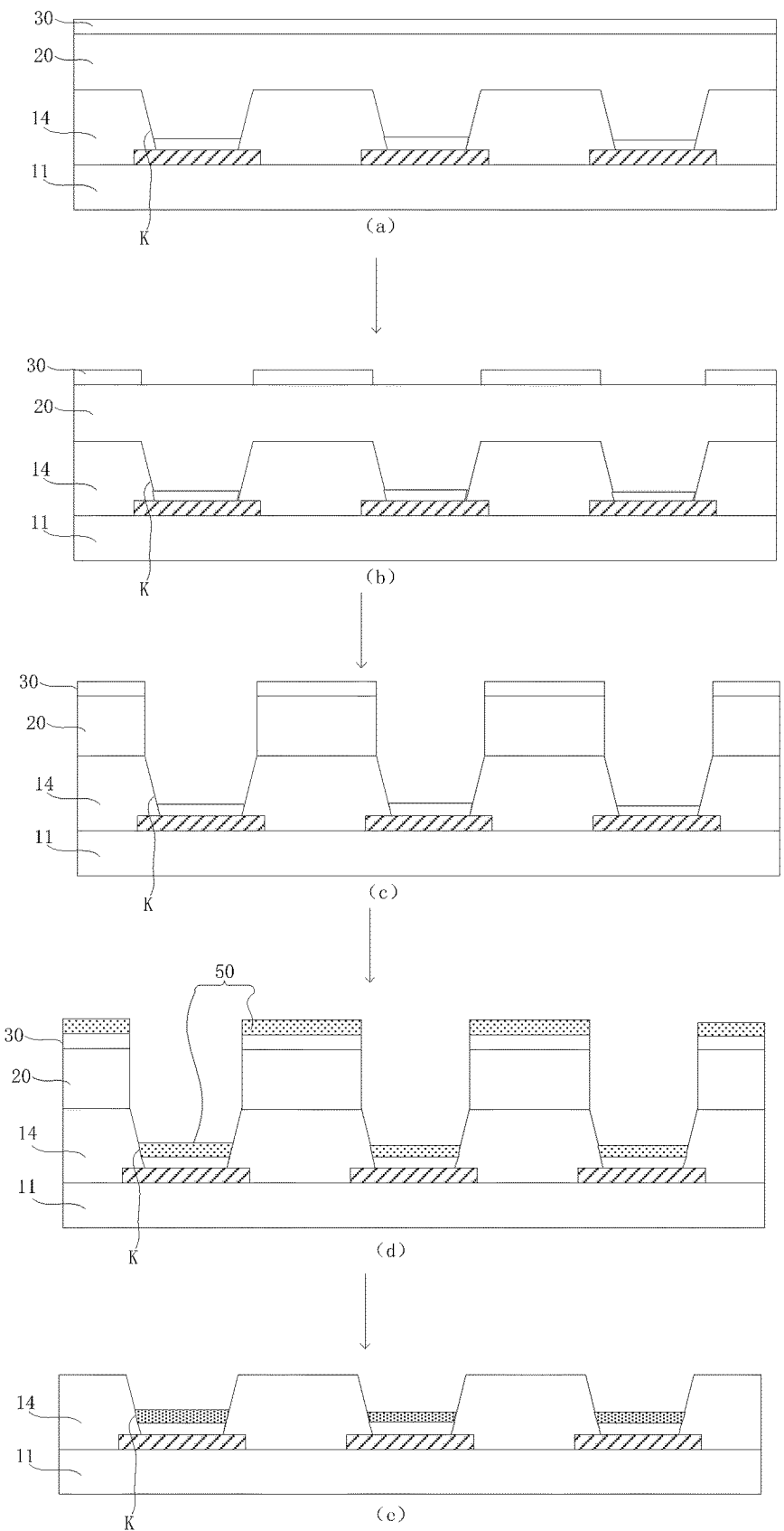
FIG. 10 is a flow chart of forming the pattered light-emitting layer shown in FIG. 3, in accordance with some embodiments.

The above records that, the first material layer 12 may be the cathode layer and the second material layer 13 is an electron transport layer; or the first material layer 12 may be an electron transport layer and the second material layer 13 is a light-emitting layer, such as an organic light-emitting layer or a quantum dot light-emitting layer. According to the above contents, it will be seen that, in a case where the first material layer 12 is a cathode layer and the second material layer 13 is an electron transport layer, as shown in FIG. 9, during forming the patterned electron transport layer ETL, as shown in (a) of FIG. 9, a sacrificial layer 20 and a photoresist layer 30 may be first formed on the base 11 where the pixel defining layer 14 has been formed, and then portions of photoresist are removed through exposure and development to expose portions of the sacrificial layer 20 to obtain the structure as shown in (b) of FIG. 9; next, the exposed portions of the sacrificial layer 20 are removed through a dry etching process, and the structure as shown in (c) of FIG. 9 is obtained after the exposed portions of the sacrificial layer 20 are removed; afterwards, a thin film 40 with an electronic transport function is formed on the base 11 by spin coating to obtain the structure as shown in (d) of FIG. 9; and finally, the photoresist and the portion of the thin film 40 with the electronic transport function formed on the sacrificial layer 20 are removed together with the sacrificial layer 20 by dissolving the sacrificial layer 20, so as to form the patterned electron transport layer to obtain the structure as shown in (e) of FIG. 9, in which each electron transport pattern is in an opening K. In a case where the first material layer 12 is the electron transport layer and the second material layer 13 is the light-emitting layer, as shown in FIG. 10, during forming the patterned light-emitting layer, as shown in (a) of FIG. 10, a sacrificial layer 20 and a photoresist layer 30 may be first formed on the base 11 where the pixel defining layer 14 has been formed, and then portions of photoresist are removed through exposure and development to expose portions of the sacrificial layer 20 to obtain the structure as shown in (b) of FIG. 10; next, the exposed portions of the sacrificial layer 20 are removed through a dry etching process, and the structure as shown in (c) of FIG. 10 is obtained after the exposed portions of the sacrificial layer 20 are removed; afterwards, a thin film 50 with a light-emitting function is formed on the base 11 by spin coating to obtain the structure as shown in (d) of FIG. 10; and finally, the photoresist 20 and a portion of the thin film 50 with the light-emitting function formed on the sacrificial layer 20 are removed together with the sacrificial layer 20 by dissolving the sacrificial layer 20, so as to form the patterned light-emitting layer to obtain the structure as shown in (e) of FIG. 10, in which each light-emitting pattern is in an opening K. In the two cases, in a case where the exposed portions of the sacrificial layer 20 are removed through the dry etching process, portions of the sacrificial layer 20 at respective openings K are generally bombarded by using a high-energy plasma. Therefore, in this embodiment, by setting the etch stop layer 15 such that the etch stop layer 15 includes at least portions in respective openings K, in a case where the sacrificial layer 20 is bombarded by using the high-energy plasma, due to existence of the etch stop layer 15, a problem may be effectively avoided that the high-energy plasma bombardment has an effect on an underlying film material (e.g., the cathode layer or the electron transport layer), which is not conducive to efficiency and stability of devices.

In addition, since the material of the etch stop layer 15 includes at least one of metal material, metal oxide and metal fluoride, the etch stop layer 15 made of inorganic materials is more resistant to the high-energy plasma than the related art in which an organic macromolecular layer is provided between the electron transport layer and the sacrificial layer 20 or nanomaterial containing organic ligands are used to form the electron transport layer.

Based on this, in some embodiments, as shown in FIGS. 5 to 8, the etch stop layer 15 further includes a portion outside the openings K, and a thickness D2 of the portion of the etch stop layer 15 located in each opening K is less than or equal to a thickness D1 of the portion of the etch stop layer 15 located outside the openings K.

According to the fact that the material of the etch stop layer 15 includes at least one of metal material, metal oxide and metal fluoride, it will be known that although the etch stop layer 15 is more resistant to the plasma bombardment than the related art in which an organic macromolecular layer is provided between the electron transport layer and the sacrificial layer 20 or nanomaterial containing organic ligands are used to form the electron transport layer, these inorganic materials can still be broken down by plasma to be etched away. Therefore, according to the fact that selected materials have different resistance to plasma, in a case where the thickness D1 of the portion of the etch stop layer 15 located outside the openings K is constant, a difference between the thickness D1 of the portion of the etch stop layer 15 located outside the openings K and the thickness D2 of the portion of the etch stop layer 15 located in each opening K will also be different. The better the resistance of the material selected for the etch stop layer 15 to the plasma is, the smaller a removed thickness of the etch stop layer 15 will be, and the larger a thickness of a portion of the finally-obtained etch stop layer 15 located in each opening K will be.

Figure 6:
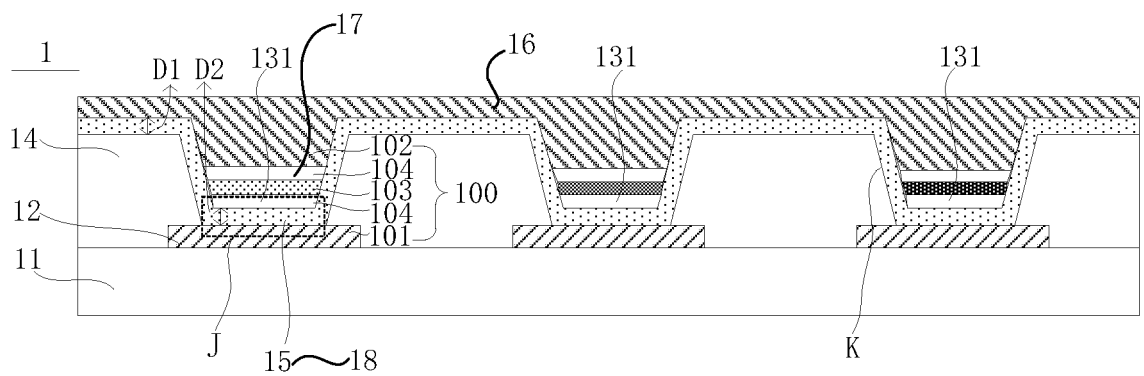
FIG. 6 is a cross-sectional structural view of a light-emitting substrate, in accordance with yet some other embodiments.
Figure 7:
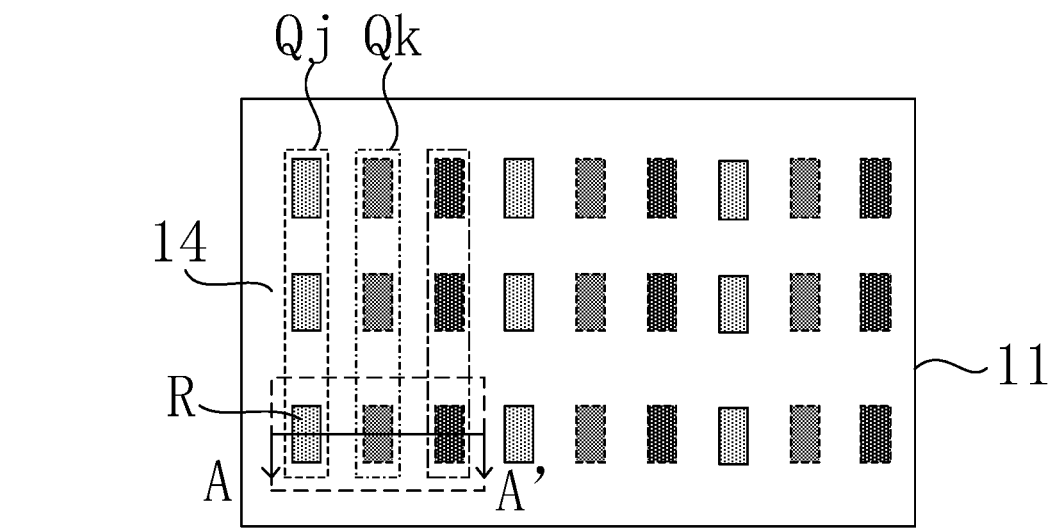
FIG. 7 shows a top structural view of a light-emitting substrate and a cross-sectional structural view of the light-emitting substrate taken along the line A-A', in accordance with some embodiments.
Figure 7:
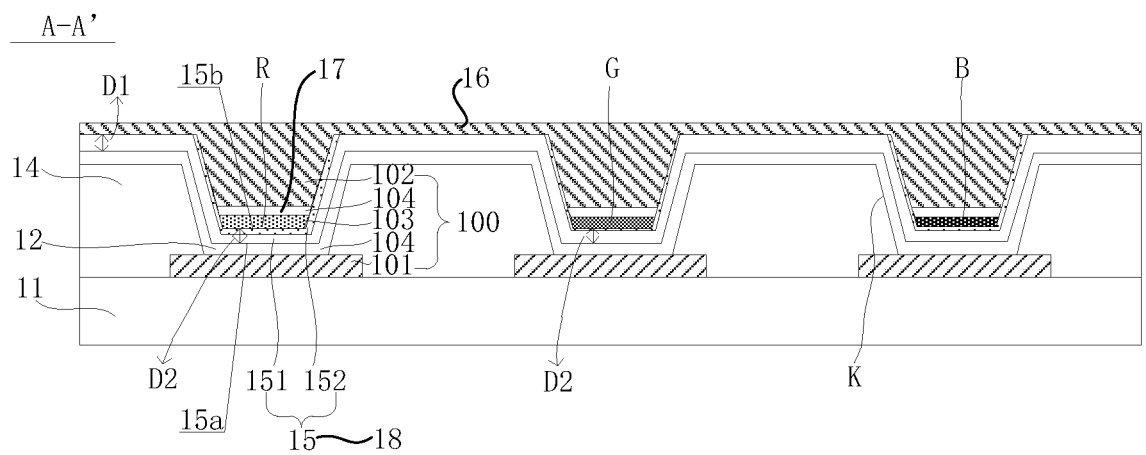
Figure 8:
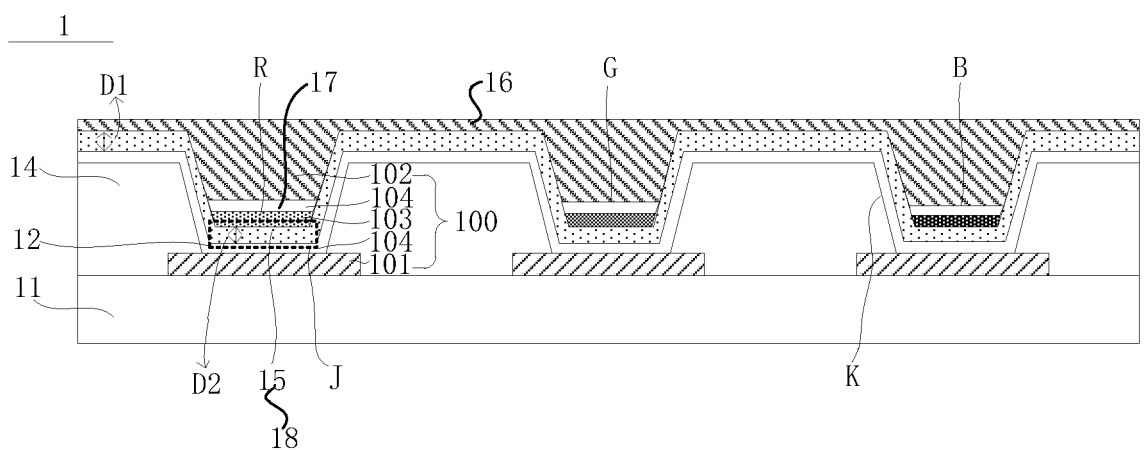
FIG. 8 is a cross-sectional structural view of a light-emitting substrate, in accordance with yet some other embodiments.

In some embodiments, as shown in FIGS. 5 to 8, the portion D2 of the etch stop layer 15 located in each opening K has a single-layer structure or a double-layer structure. In a case where the portion of the etch stop layer 15 located in each opening K has a single-layer structure, as shown in FIGS. 6 and 8, a material of the portion of the etch stop layer 15 located in each opening K is the same as a material of the portion of the etch stop layer 15 located outside the openings K, and the material includes at least one of aluminum oxide, silver oxide, molybdenum oxide and lithium fluoride. In a case where the portion of the etch stop layer 15 located in each opening K has a double-layer structure, as shown in FIGS. 5 and 7, the portion of the etch stop layer 15 located in each opening K includes a metal layer 151 and a metal oxide layer 152 that are sequentially arranged in a direction away from the base 11. A material of the metal layer 151 includes metallic aluminum and/or metallic silver, and correspondingly, a material of the metal oxide layer 152 includes an oxide of metallic aluminum and/or an oxide of metallic silver. The material of the portion of the etch stop layer 15 located outside the openings K is the same as the material of the metal layer 151.

In this embodiment, in the case where the portion of the etch stop layer 15 located in each opening K has a single-layer structure, according to the fact that a certain thickness of inorganic material will be removed through plasma bombardment, it will be seen that a material with a small breakdown thickness, such as aluminum oxide, silver oxide, molybdenum oxide and/or lithium fluoride, may be selected to form the etch stop layer 15 in a dry etching process, which is beneficial to improving an etch stop effect.

In the case where the portion of the etch stop layer 15 located in each opening K has a double-layer structure, according to the fact that oxygen atoms in the plasma react with the metal material to generate metal oxide in a plasma bombardment process, it will be seen that before dry etching, a metal thin film may be formed on the base 11, an oxygen-containing gas is used as a working gas, and a portion of the sacrificial layer 20 at each opening K is bombarded by using the plasma; according to the fact that the oxygen atoms in the plasma react with a portion of the metal thin film located in each opening K, a metal oxide layer can be formed at a surface of the portion of the metal thin film located in each opening K, so that an etch stop layer 15 of a double-layer structure including the metal layer 151 and the metal oxide layer 152 is formed. In this process, formation of metal oxide may increase a density of a film layer, which makes the film layer more resistant to plasma bombardment. Moreover, after the metal oxide layer is formed, the metal oxide layer no longer reacts with the oxygen atoms, which can protect aluminum in a lower layer from being further bombarded by plasma to be broken down, thereby improving resistance of the etch stop layer 15. In addition, for the light-emitting device 100 in which an electron transport speed is faster than a hole transport speed, a thin aluminum oxide film can play a role in blocking electrons, so that electron and hole transports are more balanced.

The energy level(s) of the portion of the etch stop layer 15 located in each overlapping region J are matched with the energy levels of the first material layer 12 and the second material layer 13 at corresponding positions, which means that for a light-emitting device 100, in a case where the first material layer 12 is a cathode layer and the second material layer 13 is an electron transport layer, a lowest unoccupied molecular orbital (LUMO) energy level of the etch stop layer 15 is between a Fermi level of the first material layer 12 and a LUMO energy level of the second material layer 13; and in a case where the first material layer 12 is an electron transport layer and the second material layer 13 is a light-emitting layer, the LUMO energy level of the etch stop layer 15 is between a LUMO energy level of the first material layer 12 and the LUMO energy level of the second material layer 13.

According to the above contents that the portion of the etch stop layer 15 located in each opening K may have a single-layer structure or a double-layer structure, it will be known that materials of portions of the etch stop layer 15 located in respective overlapping regions J may be the same or different.

According to the fact that if the materials of the portions of the etch stop layer 15 located in the respective overlapping regions J are the same, LUMO energy levels of the materials may be the same, it will be known that in a case where the portions of the etch stop layer 15 located in the respective openings K each have a single-layer structure, LUMO energy levels of the portions of the etch stop layer 15 located in the respective openings K are the same. In this case, according to the fact that the first material layer 12 may be a cathode layer or an electron transport layer, it will be known that as shown in FIGS. 6 and 8, in the case where the first material layer 12 is a cathode layer and the second material layer 13 is an electron transport layer, an absolute value of a difference between the LUMO energy level of the portion of the etch stop layer 15 located in each opening K and a Fermi level of the first material layer 12 at a corresponding position may be the same as an absolute value of a difference between the LUMO energy level of the portion of the etch stop layer 15 located in each opening K and a LUMO energy level of the second material layer 13 at a corresponding position; and in a case where the first material layer 12 is an electron transport layer and the second material layer 13 is a quantum dot light-emitting layer, an absolute value of a difference between the LUMO energy level of the portion of the etch stop layer 15 located in each opening K and a LUMO energy level of the first material layer 12 at a corresponding position may also be the same as an absolute value of a difference between the LUMO energy level of the portion of the etch stop layer 15 located in each opening K and the LUMO energy level of the second material layer 13 at a corresponding position.

For example, in the case where the first material layer 12 is a cathode layer and the second material layer 13 is an electron transport layer, a Fermi level of the cathode layer may be −4.1 eV. In this case, according to the fact that materials of respective electron transport patterns may be the same for a plurality of light-emitting devices, it will be known that LUMO energy levels of respective electron transport patterns may be the same, e.g., all being −4.3 eV, and in this case, the LUMO energy levels of the portions of the etch stop layer 15 located in respective openings K may all be −4.2 eV.

In a case where the first material layer 12 is an electron transport layer ETL and the second material layer 13 is a quantum dot light-emitting layer, according to the fact that light-emitting colors of the plurality of light-emitting devices 100 may be the same or different, absolute values of differences between the LUMO energy levels of the portions of the etch stop layer 15 located in respective openings K and the LUMO energy levels of the second material layer 13 at corresponding positions may also be the same or different.

In a case where the light-emitting colors of the plurality of light-emitting devices 100 are the same, for example, in a case where the plurality of light-emitting devices 100 each emit red light, a light-emitting material of each light-emitting device may be a red quantum dot light-emitting material. In this case, the light-emitting layer may include light-emitting patterns of a same type, such as red quantum dot light-emitting patterns. In this case, the absolute values of the differences between the LUMO energy levels of the portions of the etch stop layer 15 located in respective openings K and the LUMO energy levels of the second material layer 13 at corresponding positions may be the same, e.g., all being 0.1 eV. In a case where the light-emitting colors of the plurality of light-emitting devices 100 are different, the light-emitting layer may include i different types of light-emitting patterns, and i is an integer greater than or equal to 2. For example, the light-emitting layer may include red quantum dot light-emitting patterns R, green quantum dot light-emitting patterns G and blue quantum dot light-emitting patterns B. In this case, absolute values of differences between LUMO energy levels of portions, located between different types of quantum dot light-emitting patterns and the electron transport layer, of the etch stop layer 15 and the LUMO energy levels of the second material layer at corresponding positions may be different. For example, a difference between a LUMO energy level of a portion of the etch stop layer 15 located between a red quantum dot light-emitting pattern R and the electron transport layer and a LUMO energy level of the red quantum dot light-emitting pattern R is 0.1 eV; a difference between a LUMO energy level of a portion of the etch stop layer 15 located between a green quantum dot light-emitting pattern G and the electron transport layer and a LUMO energy level of the green quantum dot light-emitting pattern G is 0.11 eV; and a difference between a LUMO energy level of a portion of the etch stop layer 15 located between a blue quantum dot light-emitting pattern B and the electron transport layer and a LUMO energy level of the blue quantum dot light-emitting pattern B is 0.12 eV. In this case, LUMO energy levels of the portions of the etch stop layer 15 located in respective overlapping regions J may be the same.

The above is only a case where the materials of the portions of the etch stop layer 15 located in respective overlapping regions J are the same. In a case where the materials of the portions of the etch stop layer 15 located in respective overlapping regions J are different, according to the fact that the portion of the etch stop layer 15 located in each opening K may include a metal layer and a metal oxide layer that are sequentially stacked in the direction away from the base 11, it will be seen that in the case where the first material layer 12 is a cathode layer and the second material layer 13 is an electron transport layer, that the energy level(s) of the portion of the etch stop layer 15 located in each overlapping region J are matched with the energy levels of the first material layer 12 and the second material layer 13 at corresponding positions, means that, an energy level of a metal layer of the portion of the etch stop layer 15 located in each overlapping region J is matched with energy levels of the first material layer 12 and the metal oxide layer at corresponding positions, and that the energy level of the metal oxide layer of the portion of the etch stop layer 15 located in each overlapping region J is matched with energy levels of the metal layer and the second material layer 13 at corresponding positions. That is, in the case where the portion of the etch stop layer 15 located in each opening K has a double-layer structure, as shown in FIG. 5, a LUMO energy level of a first surface 15a is between the Fermi level of the first material layer 12 and a LUMO energy level of a second surface 15b, and the LUMO energy level of the second surface 15b is between the LUMO energy level of the first surface 15a and the LUMO energy level of the second material layer 13.

In this case, according to the fact that materials of cathodes in the plurality of light-emitting devices 100 may all be the same, and materials of electron transport patterns in the plurality of light-emitting devices 100 may also be the same, it will be seen that absolute values of differences between LUMO energy levels of first surfaces 15a and the Fermi levels of the first material layer 12 at corresponding positions may all be the same, e.g., all being less than 0.15 eV; and absolute values of differences between LUMO energy levels of second surfaces 15b and the LUMO energy levels of the second material layer at corresponding positions may also be the same, e.g., all being less than 0.15 eV.

In a case where the first material layer 12 is an electron transport layer, the second material layer 13 is a quantum dot light-emitting layer, and the portion of the etch stop layer 15 located in each opening K has a double-layer structure, that the energy level(s) of the portion of the etch stop layer 15 located in each overlapping region J are matched with the energy levels of the first material layer 12 and the second material layer 13 at corresponding positions, means that, for a light-emitting device 100, the LUMO energy level of the first surface 15a is between the LUMO energy level of the first material layer 12 and the LUMO energy level of the second surface 15b, and the LUMO energy level of the second surface 15b is between the LUMO energy level of the first surface 15a and the LUMO energy level of the second material layer 13.

In this case, according to the fact that the materials of the electron transport patterns in the plurality of light-emitting devices 100 may be the same, it will be seen that the absolute values of the differences between the LUMO energy levels of the first surfaces 15a and the LUMO energy levels of the first material layer 12 at corresponding positions may also be the same, e.g., all being less than 0.15 eV. According to the fact that materials of quantum dot light-emitting patterns in the plurality of light-emitting devices 100 may be the same or different, it will be seen that in the case where the light-emitting colors of the plurality of light-emitting devices 100 are the same, for example, in the case where the plurality of light-emitting devices 100 each emit red light, a light-emitting material of each light-emitting device may be a red quantum dot light-emitting material. In this case, the light-emitting layer may include light-emitting patterns of a same type, such as red quantum dot light-emitting patterns. In this case, the absolute values of the differences between the LUMO energy levels of the second surfaces 15b and the LUMO energy levels of the second material layer 13 at corresponding positions may also be the same, e.g., all being 0.1 eV. In a case where the light-emitting colors of the plurality of light-emitting devices 100 are different, the light-emitting layer may include i different types of light-emitting patterns, and i is an integer greater than or equal to 2. For example, the light-emitting layer may include red quantum dot light-emitting patterns R, green quantum dot light-emitting patterns G and blue quantum dot light-emitting patterns B. In this case, according to the fact that in a case where LUMO energy levels of first surfaces 15a of the portions of the etch stop layer 15 located in respective overlapping regions J are the same, LUMO energy levels of second surfaces 15b of the portions of the etch stop layer 15 located in respective overlapping regions J may be the same or different, the absolute values of the differences between the LUMO energy levels of the second surfaces 15b and the LUMO energy levels of the second material layer 13 at corresponding positions may also be the same or different. For example, in some embodiments, an absolute value of a difference between a LUMO energy level of a second surface 15b and a LUMO energy level of a red quantum dot light-emitting pattern R at a corresponding position, an absolute value of a difference between a LUMO energy level of a second surface 15b and a LUMO energy level of a green quantum dot light-emitting pattern G at a corresponding position, an absolute value of a difference between a LUMO energy level of a second surface 15b and a LUMO energy level of a blue quantum dot light-emitting pattern B at a corresponding position may all be the same, e.g., all being 0.1 eV. In this case, according to the fact that LUMO energy levels of the red quantum dot light-emitting pattern R, the green quantum dot light-emitting pattern G and the blue quantum dot light-emitting pattern B are different, the LUMO energy levels of the second surfaces 15b of the portions of the etch stop layer 15 located in corresponding overlapping regions J are also different. For example, in a case where the LUMO energy levels of the red quantum dot light-emitting pattern R, the green quantum dot light-emitting pattern G and the blue quantum dot light-emitting pattern B are −3.8 eV, −3.7 eV and −3.6 eV, respectively, a LUMO level of a second surface 15b of a portion of the etch stop layer 15 located between the red quantum dot light-emitting pattern R and the electron transport layer, a LUMO level of a second surface 15b of a portion of the etch stop layer 15 located between the green quantum dot light-emitting pattern G and the electron transport layer and a LUMO level of a second surface 15b of a portion of the etch stop layer 15 located between the blue quantum dot light-emitting pattern B and the electron transport layer are −3.7 eV, −3.6 eV and −3.5 eV, respectively. In some other embodiments, an absolute value of a difference between a LUMO energy level of a second surface 15b and a LUMO energy level of a red quantum dot light-emitting pattern R at a corresponding position, an absolute value of a difference between a LUMO energy level of a second surface 15b and a LUMO energy level of a green quantum dot light-emitting pattern G at a corresponding position, and an absolute value of a difference between a LUMO energy level of a second surface 15b and a LUMO energy level of a blue quantum dot light-emitting pattern B at a corresponding position may be different, e.g., being 0.13 eV, 0.12 eV and 0.11 eV, respectively. In this case, according to the fact that the LUMO energy levels of the red quantum dot light-emitting pattern R, the green quantum dot light-emitting pattern G and the blue quantum dot light-emitting pattern B are different, being −3.63 eV, −3.62 eV and −3.61 eV, respectively, a LUMO energy level of a second surface 15b of a portion of the etch stop layer 15 located between the red quantum dot light-emitting pattern R and the electron transport layer, a LUMO energy level of a second surface 15b of a portion of the etch stop layer 15 located between the green quantum dot light-emitting pattern G and the electron transport layer, and a LUMO energy level of a second surface 15b of a portion of the etch stop layer 15 located between the blue quantum dot light-emitting pattern B and the electron transport layer may be the same, e.g., all being −3.5 eV.

In this embodiment, by matching the energy levels of the portion of the etch stop layer 15 located in each overlapping region J with the energy levels of the first material layer 12 and the second material layer 13 at corresponding positions, the etch stop layer 15 may be made not to affect carrier transport and injection.

In some embodiments, as shown in FIGS. 5 to 8, a difference between a thickness D1 of the portion of the etch stop layer 15 located outside the openings K and a thickness D2 of the portion of the etch stop layer 15 located in each opening K is less than 5 nm. In this embodiment, under a premise of taking into account a bombardment speed, bombardment time and energy of the plasma, by selecting a suitable material for the etch stop layer 15 such that the difference between the thickness D1 of the portion of the finally-obtained etch stop layer 15 located outside the openings K and the thickness D2 of the portion of the etch stop layer 15 located in each opening K is controlled to be within a range of less than 5 nm, a very good etch stop effect may be achieved.

In some embodiments, as shown in FIGS. 5 to 8, the thickness D1 of the portion of the etch stop layer 15 located outside the openings K is in a range from 0.5 nm to 50 nm, inclusive. In this embodiment, by limiting the thickness D1 of the portion of the etch stop layer 15 located outside the openings K to the above range, it is possible to avoid a problem that the thickness of the etch stop layer 15 is too large, which is not conducive to carrier transport and injection.

In some embodiments, as shown in FIG. 7, the plurality of openings K include i opening groups Q, and i is an integer greater than or equal to 2. Each opening group Q corresponds to light-emitting patterns of a respective type. Thicknesses D2 of portions of the etch stop layer 15 located in a j-th opening group Qj are the same as thicknesses D2 of portions of the etch stop layer 15 located in a k-th opening group Qk; j and k are each any one of 1 to i, and values of j and k are different.

For example, by taking an example in which the j-th opening group Qj corresponds to the red quantum dot light-emitting patterns R, and the k-th opening group corresponds to the green quantum dot light-emitting patterns G, in a case where the portions of the etch stop layer 15 located in the j-th opening group Qj are subjected to plasma bombardment at the same rate, time and energy as the portions of the etch stop layer 15 located in the k-th opening group Qk, the thicknesses D2 of the portions of the etch stop layer 15 located in the j-th opening group Qj are the same as the thicknesses D2 of the portions of the etch stop layer 15 located in the k-th opening group; in a case where the portions of the etch stop layer 15 located in the j-th opening group are subjected to plasma bombardment at a different rate, time and energy from the portions of the etch stop layer 15 located in the k-th opening group Qk, the thicknesses D2 of the portions of the etch stop layer 15 located in the j-th opening group Qj are different from the thicknesses D2 of the portions of the etch stop layer 15 located in the k-th opening group Qk.

In this embodiment, a case where the thicknesses D2 of the portions of the etch stop layer 15 located in the j-th opening group Qj are the same as the thicknesses D2 of the portions of the etch stop layer 15 located in the k-th opening group Qk is described.

In some embodiments, the above quantum dot light-emitting materials are mainly composed of IIB-VIA, IIIA-VA or IVA-VIA group elements. For example, the quantum dot light-emitting material may include one or more of ZnS, ZnSe, ZnTe, CdS, CdSe, CdTe, HgTe, InP, CuInS, CuInSe, CuInSeS and AgInS.

In some embodiments, quantum dots in the quantum dot light-emitting material may have a core-shell structure. For example, the quantum dot light-emitting material may include CdS/ZnS, CdSe/ZnS, CdSe/ZnSeS, CdSe/CdS, ZnSe/ZnS, InP/ZnS, CuInS/ZnS, AgInS/ZnS, CuInSeZnS, CuInSeS/ZnS or PbS/ZnS. An element before "/" is the core, and an element after "/" is the shell.

In some other embodiments, the quantum dot light-emitting material may further include a ligand, and the ligand is bound to quantum dots.

It will be noted that emission spectra of quantum dots with different sizes and materials are in different wavelength ranges. For example, emission spectra of ZnS quantum dots with different sizes basically cover an ultraviolet region, emission spectra of CdSe quantum dots basically cover a visible region, and emission spectra of PbSe quantum dots basically cover an infrared region. In practical applications, the quantum dot light-emitting materials with different sizes and materials may be selected according to different emission colors.

Based on the above structure, in some embodiments, as shown in FIGS. 5 and 6, in a case where the first material layer 12 is a cathode layer, the light-emitting substrate 1 further includes an anode layer 16 disposed at a side of the first material layer 12 away from the base 11, a quantum dot light-emitting layer between the anode layer 16 and the second material layer 13, and a hole transport layer 17 between the quantum dot light-emitting layer and the anode layer 16.

As shown in FIGS. 7 and 8, in a case where the first material layer 12 is an electron transport layer, the light-emitting substrate 1 further includes an anode layer 16 disposed at the side of the first material layer 12 away from the base 11, and a hole transport layer 17 between the anode layer and the second material layer 13.

In some embodiments of the present disclosure, a light-emitting substrate 1 is provided. As shown in FIGS. 5 to 8, the light-emitting substrate 1 includes a base 11, a first material layer 12 and a second material layer 13 that are disposed on the base 11. The first material layer 12 is closer to the base 11 than the second material layer 13. A material of the first material layer 12 includes a conductive material or a carrier transport material. The second material layer 13 is a patterned material layer including a plurality of patterns 131. There is an overlapping region J between each pattern 131 and the first material layer 12.

According to the fact that the light-emitting substrate 1 includes a plurality of light-emitting devices 100, each light-emitting device 100 includes a first electrode 101, a second electrode 102, a light-emitting pattern 103 disposed between the first electrode 101 and the second electrode 102, and carrier transport patterns 104 disposed between the light-emitting pattern 103 and the first electrode 101 and between the light-emitting pattern 103 and the second electrode 102, it will be known that, in a first case (a case where the first material layer 12 includes a conductive material), as shown in FIG. 5, the first material layer 12 may be an electrode layer, and in this case, the second material layer 13 may be a patterned carrier transport layer. For example, the first material layer 12 may be a cathode layer, and in this case, the second material layer 13 is a patterned electron transport layer (ETL), and each electron transport pattern is a pattern. In this case, the base 11 may be a base formed with a pixel driving circuit, the first material layer 12 includes a plurality of spaced cathodes, and there is an overlapping region J between each electron transport pattern and a respective cathode. In a second case (a case where the material of the first material layer 12 includes a carrier transport material), as shown in FIG. 7, the first material layer 12 may be an electron transport layer ETL, and in this case, the second material layer 13 may be a patterned light-emitting layer including a plurality of light-emitting patterns. In this case, the base 11 may be a base formed with a pixel driving circuit, a cathode layer and a pixel defining layer 14. The pixel defining layer 14 defines a plurality of openings K. As shown in FIG. 2, the first material layer 12 may be a whole layer, or as shown in FIG. 3, the first material layer 12 only includes portions in respective openings K, and each light-emitting pattern is in an opening K and forms an overlapping region J with a portion of the first material layer 12 in the opening K.

In some embodiments, as shown in FIGS. 5 to 8, the light-emitting substrate 1 further includes a third material layer 18 between the first material layer 12 and the second material layer 13. The third material layer 18 includes at least portions in respective overlapping regions J. A portion of the third material layer 18 located in each overlapping region J is in contact with the first material layer 12 and the second material layer 13 at corresponding positions. The third material layer 18 includes at least one of metal, metal oxide and metal fluoride. Energy level(s) of the portion of the third material layer 18 located in each overlapping region J are matched with energy levels of the first material layer 12 and the second material layer 13 at corresponding positions.

According to the above contents that in a case where a patterned electron transport layer or light-emitting layer is formed, by forming an etch stop layer 15 at least in regions in respective openings K on the base 11, it is possible to block plasma bombardment of an underlying film material such as the cathode layer or the electron transport layer, thereby solving a problem that high-energy plasma bombardment affects the underlying film material, which is not conducive to efficiency and stability of devices, it will be known that after the bombardment is completed, the film for forming the etch stop layer 15 will not be completely bombarded, but will remain. In this case, a portion of the film remaining on the base 11 is the third material layer 18. In a case where the third material layer 18 exists, in order to prevent the portions of the third material layer 18 located in respective overlapping region J from affecting injection and transport of electrons and holes, the third material layer 18 needs to meet a condition that the energy level(s) of the portion of the third material layer 18 located in each overlapping region J are matched with the energy levels of the first material layer 12 and the second material layer 13 at corresponding positions.

According to the above contents that the third material layer 18 includes at least one of metal, metal oxide and metal fluoride, it will be known that during the plasma bombardment, a working gas used in the plasma may be a gas that cannot react with metals, e.g., argon. In this case, there are two possible cases. In a first case, as shown in FIGS. 6 and 8, a material of the etch stop layer 15 only includes a metal material. With the bombardment of the plasma, a portion of the metal material is bombarded away and does not react with the plasma. Therefore, a material of a portion, remaining in each overlapping region J, of a film for forming the third material layer also includes only a metal material. In a second case, as shown in FIGS. 6 and 8, the material of the etch stop layer 15 includes metal fluoride and/or metal oxide. In this case, similarly to the metal material, with the bombardment of the plasma, the material of the portion, remaining in each overlapping region J, of a film for forming the third material layer 18 also includes only metal fluoride and/or metal oxide.

During the plasma bombardment, the working gas used in the plasma may be a gas capable of reacting with metal, such as an oxygen-containing gas. In this case, according to whether the etch stop layer contains a metal material, there are also two possible cases. In a first case, as shown in FIGS. 5 and 7, the material of the film for forming the etch stop layer 15 includes a metal material, and with the bombardment of the plasma, the metal material will react with the oxygen atoms in the plasma to generate a metal oxide. In this case, the third material layer 18 may have a double-layer structure, including a metal layer and a metal oxide layer. A material of the metal layer includes metallic aluminum and/or metallic silver, and correspondingly, a material of the metal oxide layer includes an oxide of metallic aluminum and/or an oxide of metallic silver. In a second case, as shown in FIGS. 6 and 8, the material of the film for forming the etch stop layer 15 does not include a metal material. In this case, the material of the etch stop layer 15 may include metal oxide and/or metal fluoride, such as at least one of aluminum oxide, silver oxide, molybdenum oxide and lithium fluoride. With the bombardment of the plasma, only a portion of the metal oxide and/or a portion of metal fluoride is bombarded away, and thus the portion, remaining in each overlapping region J, of the film for forming the third material layer 18 may have a single-layer structure. In this case, a material of a portion of the third material layer 18 located outside the openings K and a material of a portion of the third material layer 18 located in each opening K may be the same, e.g., both includes at least one of aluminum oxide, silver oxide, molybdenum oxide and lithium fluoride.

Based on this, with respect to a description that energy level(s) of the portion of the third material layer 18 located in each overlapping region J are matched with energy levels of the first material layer 12 and the second material layer 13 at corresponding positions, reference may be made to the above description that the energy level(s) of the portion of the etch stop layer 15 located in each overlapping region J are matched with energy levels of the first material layer 12 and the second material layer 13 at corresponding positions, and details will not be repeated herein.

Some embodiments of the present disclosure provide a method for manufacturing a light-emitting substrate, and the method includes:

as shown in FIGS. 5 to 8, forming a first material layer 12, an etch stop layer 15 and a second material layer 13 sequentially on a base 11. A material of the first material layer 12 includes a conductive material or a carrier transport material. The second material layer 13 is a patterned material layer including a plurality of patterns 131. There is an overlapping region J between each pattern 131 and the first material layer 12. The etch stop layer 15 includes at least portions in respective overlapping regions J. A portion of the etch stop layer 15 located in each overlapping region J is in contact with the first material layer 12 and the second material layer 13 at corresponding positions. A material of the etch stop layer 15 includes at least one of metal material, metal oxide and metal fluoride; energy level(s) of the portion of the etch stop layer 15 located in each overlapping region J are matched with energy levels of the first material layer 12 and the second material layer 13 at corresponding positions.

According to the above contents that the first material layer 12 may be a cathode layer and the second material layer 13 may be an electron transport layer, it will be known that the second material layer 13 may be formed by a same patterning process. The second material layer 13 may be regarded as patterns of a same type. In this case, the second material layer 13 includes patterns 131 of a same type. According to the above contents that the first material layer 12 may be an electron transport layer and the second material layer 13 may be a light-emitting layer and according to the fact that a plurality of light-emitting devices 100 may include light-emitting devices 100 emitting light with the same color, the light-emitting layer may emit monochromatic light, and the second material layer 13 may be regarded as patterns of the same type. In this case, the second material layer 13 also includes patterns 131 of a same type. According to the fact that the plurality of light-emitting devices 100 may include light-emitting devices emitting light with different colors, the second material layer 13 may be regarded as including different types of light-emitting patterns, such as including three types of patterns: red quantum dot light-emitting patterns R, green quantum dot light-emitting patterns G and blue quantum dot light-emitting patterns B.

Figure 11:
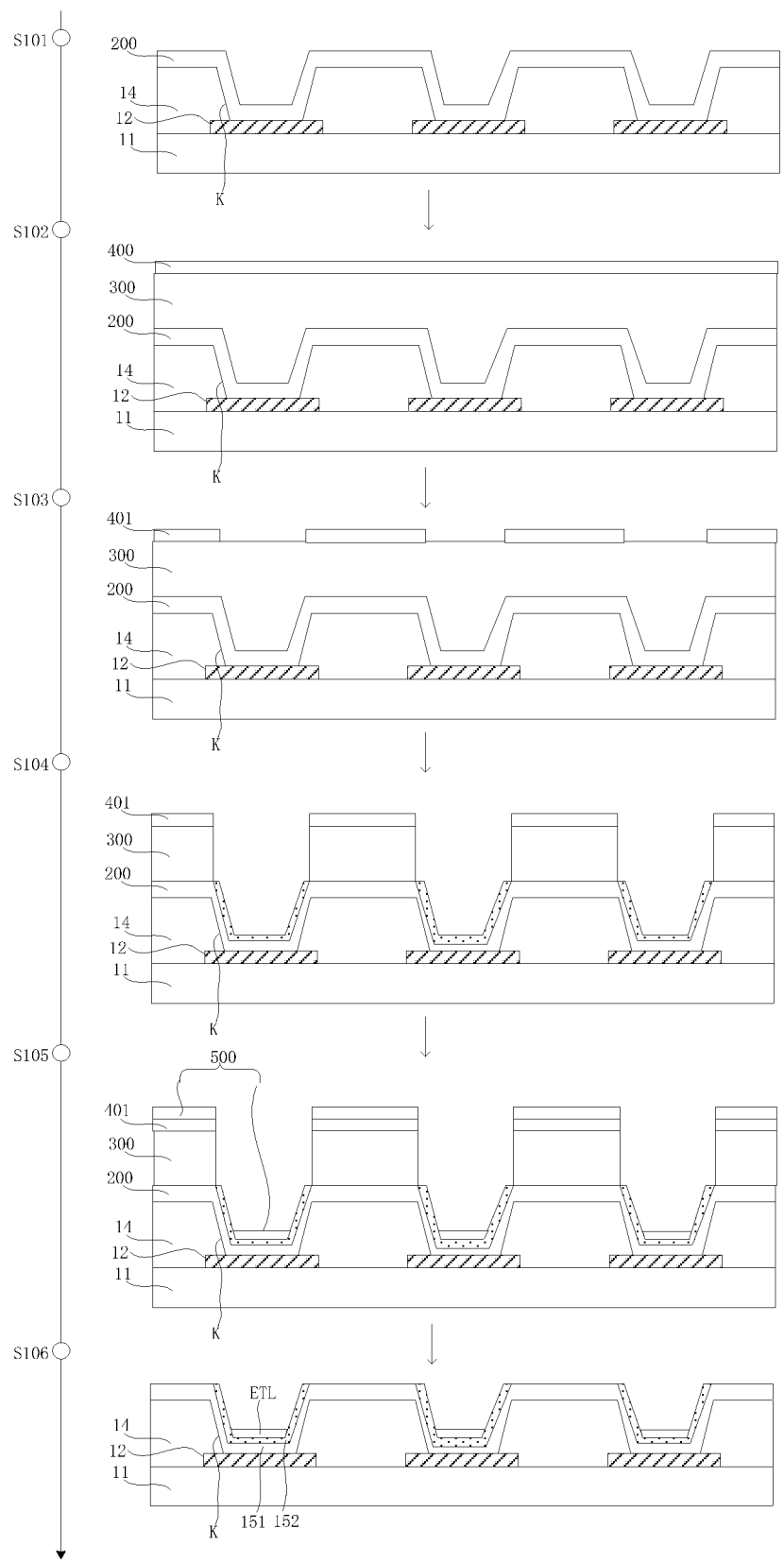
FIG. 11 is a flow chart of forming the patterned electron transport layer shown in FIG. 5, in accordance with some embodiments.
Figure 12:
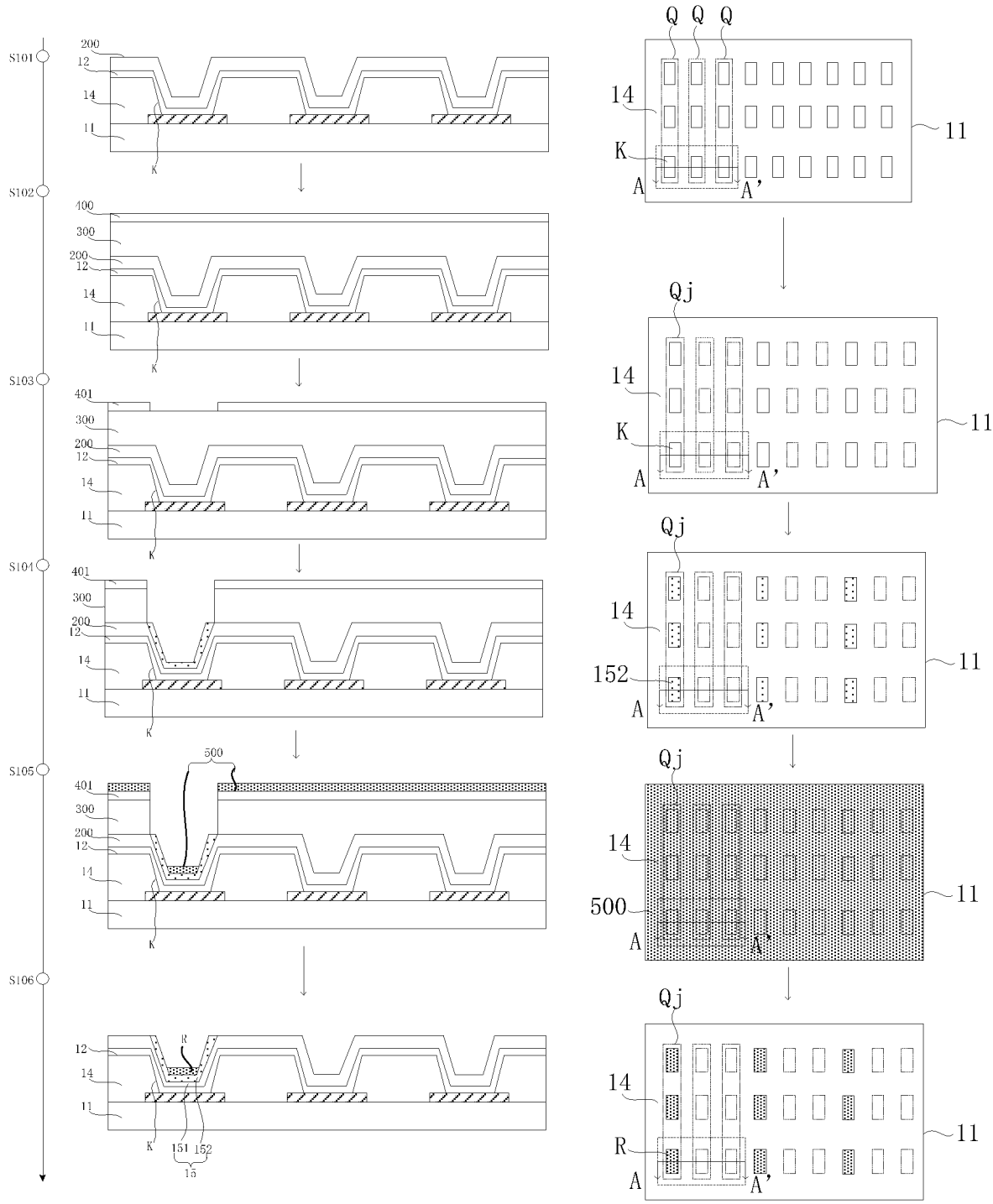
FIG. 12 is a flow chart of forming the patterned light-emitting layer shown in FIG. 7, in accordance with some embodiments.

Based on this, in some embodiments, the second material layer 13 includes one or i types of patterns, and i is an integer greater than or equal to 2. Forming the first material layer 12, the etch stop layer 15 and the second material layer 13 sequentially on the base 11, as shown in FIGS. 11 and 12, includes S101 to S106.

In S101, the first material layer 12 and a first thin film 200 are sequentially formed on the base 11. A material of the first thin film 200 includes metallic aluminum and/or metallic silver, or the material of the first thin film 200 includes at least one of aluminum oxide, silver oxide, molybdenum oxide and lithium fluoride.

In a case where the first material layer 12 is a cathode layer including a plurality of cathodes, the material of the first material layer 12 may include indium tin oxide (ITO). An ITO thin film is deposited, a photoresist layer is formed on the ITO thin film, and then the first material layer 12 is formed through exposure, development and etching processes. In this case, after the first material layer 12 is formed, the method may further include forming a pixel defining layer 14 on the base where the first material layer 12 has been formed. The pixel defining layer 14 defines a plurality of openings K and each opening K exposes a cathode. Next, the first thin film 200 is formed on the base 11 where the pixel defining layer 14 has been formed. In this case, the base 11 may be a base where a pixel driving circuit has been formed.

In a case where the first material layer 12 is an electron transport layer, the material of the first material layer 12 may include nano-zinc oxide, and the first material layer 12 may be formed through a spin coating or printing process. In this case, the first thin film 200 may be directly formed on the base where the first material layer 12 has been formed. The base 11 may be a base where the pixel driving circuit, the cathode layer and the pixel defining layer 14 have been formed. In this case, the first material layer 12 may be a whole layer, or may be formed only in the openings K defined by the pixel defining layer 14.

In the above two cases, the first thin film 200 may be formed through evaporation, deposition or sputtering.

In some embodiments, forming the first thin film 200 on the base 11, includes:

forming the first thin film 200 on the base 11 through an evaporation process.

Figure 13:
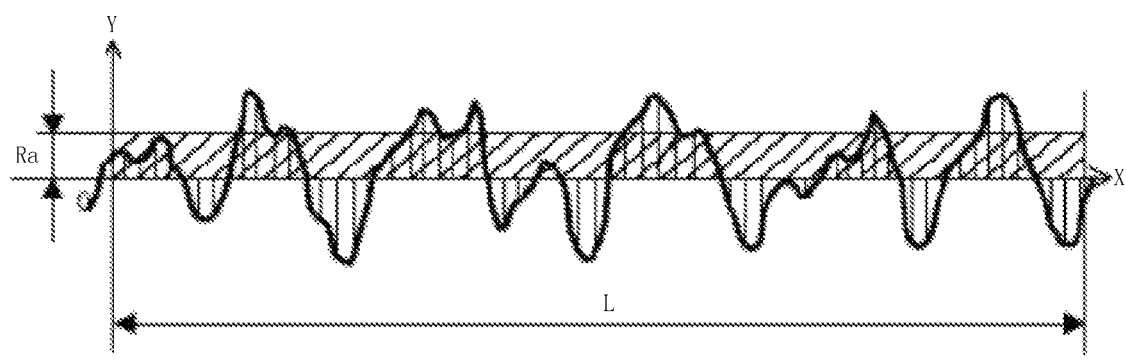
FIG. 13 is a graph showing evaluation of surface roughness by using a contour arithmetic mean deviation Ra as a parameter, in accordance with some embodiments.

After the first thin film 200 is formed, a roughness Ra of a surface of the first thin film 200 away from the base 11 is found by testing to be less than 0.1. The roughness refers to unevenness of a processed surface with a small pitch and minute peaks and valleys. Ra is a contour arithmetic mean deviation, and as shown in FIG. 13, the contour arithmetic mean deviation Ra is a value which takes a center line as a reference line and takes a sum of an average value of a peak height of a contour and an average value of a valley depth of the contour within a sampling length L as an average height of microscopic unevenness of the contour.

It will be seen that the roughness of the surface of the first thin film 200 may be reduced by forming the first thin film 200 through an evaporation process, and it is not easy to damage other layers during a film forming process; and it can also avoid a problem that the roughness of the first thin film 200 is large, and formed spikes are likely to pierce the electron transport layer to cause a short circuit between the metal and the cathode layer.

In S102, a j-th sacrificial layer 300 and a j-th photoresist layer 400 are sequentially formed on the base where the first material layer 12 and the first thin film 200 have been formed.

According to the above contents that the first material layer 12 is a cathode layer and the second material layer 13 is a patterned electron transport layer, the second material layer 13 may be regarded as including only patterns of a same type. In this case, j is equal to 1, and the j-th sacrificial layer 300 may be denoted as a first sacrificial layer, and the j-th photoresist layer 400 may be denoted as a first photoresist layer.

According to the above contents that the first material layer 12 is an electron transport layer, and the second material layer 13 is a patterned light-emitting layer, the light-emitting layer may include light-emitting patterns of a same type or i types of light-emitting patterns. In this case, in a case where the light-emitting layer includes light-emitting patterns of a same type, j may also be equal to 1, and the j-th sacrificial layer 300 and the j-th photoresist layer 400 may also be denoted as the first sacrificial layer and the first photoresist layer, respectively.

In a case where the light-emitting layer includes i types of light-emitting patterns, j is any one of 1 to i. In this case, the j-th sacrificial layer 300 may be denoted as the first sacrificial layer, . . . , a (i−1)-th sacrificial layer or an i-th sacrificial layer. The j-th photoresist layer 400 may also be denoted as the first photoresist layer, . . . , a (i−1)-th photoresist layer or an i-th photoresist layer.

For example, by taking an example in which the light-emitting layer includes three types of light-emitting patterns, such as red quantum dot light-emitting patterns, green quantum dot light-emitting patterns and blue quantum dot light-emitting patterns, the red quantum dot light-emitting patterns, the green quantum dot light-emitting patterns and the blue quantum dot light-emitting patterns are denoted as first quantum dot light-emitting patterns, second quantum dot light-emitting patterns and third quantum dot light-emitting patterns, respectively. In a case where the first quantum dot light-emitting patterns are formed, the first sacrificial layer and the first photoresist layer are sequentially formed on the base 11 where the first material layer 12 and the first thin film 200 have been formed. In a case where the second quantum dot light-emitting patterns are formed, a second sacrificial layer and a second photoresist layer are sequentially formed on the base where the first material layer 12 and the first thin film 200 have been formed. In a case where the third quantum dot light-emitting patterns are formed, a third sacrificial layer and a third photoresist layer are sequentially formed on the base where the first material layer 12 and the first thin film 200 have been formed.

In S103, a j-th photoresist pattern layer 401 is formed through exposure and development to expose portions of the j-th sacrificial layer 300 located in a j-th region.

In some embodiments, in a case where the above method further includes forming a pixel defining layer 14, and as shown in FIG. 12, the pixel defining layer 14 defines the plurality of openings K, and the plurality of openings K include i opening groups Q, the j-th region is a region where a j-th opening group Qj in the i opening groups Qi is located. For example, by taking an example in which j is equal to 1, and the first quantum dot light-emitting pattern is a red quantum dot light-emitting pattern, the j-th region is a region where a first opening group Q1 is located, that is, a region where the red quantum dot light-emitting patterns are located.

In S104, portions of the j-th sacrificial layer 300 located in the j-th region are bombarded by using the plasma to remove the portions of the j-th sacrificial layer located in the j-th region.

That the portions of the j-th sacrificial layer 300 located in the j-th region are bombarded by using the plasma may be that portions of the j-th sacrificial layer 300 located in a region where the j-th opening group Qj is located are bombarded by using the plasma.

In some embodiments, the working gas used in the plasma includes at least one of oxygen and argon. While the portions of the j-th sacrificial layer located in the j-th region are bombarded by using the plasma, portions of the first thin film 200 located in the j-th region will also be bombarded by the high-energy plasma. However, due to existence of the first thin film 200, it is possible to avoid the high-energy plasma from damaging the underlying film material.

In some embodiments, in a case where the material of the first thin film 200 includes metallic aluminum and/or metallic silver, the working gas used in the plasma is an oxygen-containing gas to form a oxide layer of metallic aluminum and/or a oxide layer of metallic silver on surfaces of portions of the first thin film 200 located in the j-th region after removing the portions of the j-th sacrificial layer located in the j-th region.

In this embodiment, by using an oxygen-containing gas as the working gas, oxygen atoms in the plasma can react with aluminum atoms on a surface of metallic aluminum to generate an oxide of metallic aluminum and/or, can react with silver atoms on a surface of metallic silver to generate an oxide of metallic silver, so that a corresponding metal oxide layer can be formed on a surface of a metal thin film.

Using an oxygen-containing gas as the working gas makes the metal oxide layer have a higher density and be more resistant to plasma bombardment than using other working gases. Moreover, by forming the metal oxide layer, the metal oxide no longer reacts with oxygen atoms, which can shield underlying metals and prevent the plasma from breaking down the underlying metals, which affects the underlying film material. Furthermore, electrons can also be blocked by forming the metal oxide layer, which is conducive to a more balanced electron and hole transport.

In S105, a second thin film 500 is formed on the base where the portions of the j-th sacrificial layer located in the j-th region have been removed. The second thin film 500 includes portions in the j-th region and a portion on a surface of the j-th photoresist pattern layer 401 away from the base 11.

In the case where the first material layer 12 is a cathode layer, the second thin film 500 may be a thin film with an electronic transport function, and may be formed through a spin coating or evaporation process.

In the case where the first material layer 12 is an electron transport layer, the second thin film 500 may be a thin film with a light-emitting function, and may be formed through a spin coating or printing process.

Herein, by taking an example in which j is equal to 1, and the second material layer 12 is a patterned quantum dot light-emitting layer, the second thin film 300 may be a red quantum dot light-emitting film.

In S106, a portion of the j-th sacrificial layer located outside the j-th region is removed, and the j-th photoresist pattern layer 401 on the j-th sacrificial layer and the portion of the second thin film 500 located on the surface of the j-th photoresist pattern layer 401 away from the base 11 are removed together with the portion of the j-th sacrificial layer located outside the j-th region.

For example, the portion of the j-th sacrificial layer located outside the j-th region may be removed by dissolving with an organic solvent, so that the j-th photoresist pattern layer 401 on the j-th sacrificial layer and a portion of the second thin film 500 located outside the j-th region can be removed together with the portion of the j-th sacrificial layer located outside the j-th region.

Herein, in a case where the first material layer 12 is a cathode layer and the second material layer 13 is an electron transport layer, according to the above contents that the electron transport layer includes patterns of a same type, j may be equal to 1, it will be known that the j-th region is a region where respective openings K are located. In this case, the etch stop layer 15 includes portions in respective openings K and is formed through the same bombardment process.

In a case where the first material layer 12 is an electron transport layer and the second material layer 13 is a light-emitting layer, according to the above contents that the j-th region may include the region where the j-th opening group Qj is located, and j may be any one of 1 to i, it will be seen that as shown in FIG. 7, the etch stop layer 15 may also include portions in respective openings K, and portions of the etch stop layer 14 located in different opening groups are respectively formed by different times of bombardment processes.

The above contents only describe the cases where the first material layer 12 is a cathode layer and the second material layer 13 is an electron transport layer, and the first material layer 12 is an electron transport layer and the second material layer 13 is a light-emitting layer. It will be understood by a person skilled in the art that the second material layer 13 may be any material layer that needs to be patterned, and is not limited to the above two cases. Moreover, the first material layer 12 and the second material layer 13 may each be one layer or a plurality of layers, and in a case where the first material layer 12 includes a plurality of layers, materials of the plurality of layers of the first material layer 12 may be different. For example, the plurality of layers of the first material layer 12 may be a cathode layer and an electron transport layer. In this case, accordingly, the light-emitting substrate 1 may include an etch stop layer 15 formed between the cathode layer and the electron transport layer, and an etch stop layer 15 formed between the electron transport layer and the light-emitting layer.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate, comprising:
a base;
a first material layer and a second material layer that are disposed on the base, the first material layer being closer to the base than the second material layer, a material of the first material layer including a conductive material or a carrier transport material, the second material layer being a-p attemed-material layer-including a plurality of patterns, and each pattern and the first material layer having an overlapping region therebetween; and
an etch stop layer between the first material layer and the second material layer, the etch stop layer including at least portions in respective overlapping regions, a portion of the etch stop layer located in each overlapping region being in contact with the first material layer and the second material layer at corresponding-positions, and a material of the etch stop layer including at least one of metal material, metal oxide and metal fluoride, wherein
at least one energy level of the portion of the etch stop layer located in each overlapping region is matched with energy levels of the first material layer and the second material layer at corresponding positions.

2. The light-emitting substrate according to claim 1, further comprising a pixel defining layer disposed on the base, the pixel defining layer defining a plurality of openings, each pattern being in an opening, and the etch stop layer including at least portions in respective openings.

3. The light-emitting substrate according to claim 2, wherein
the etch stop layer further includes a portion outside the openings, and a thickness of a portion of the etch stop layer located in each opening is less than or equal to a thickness of the portion of the etch stop layer located outside the openings.

4. The light-emitting substrate according to claim 3, wherein the portion of the etch stop layer located in each opening has a single-layer structure;
a material of the portion of the etch stop layer located in each opening is the same as a material of the portion of the etch stop layer located outside the openings, each including at least one of aluminum oxide, silver oxide, molybdenum oxide and lithium fluoride; or
the portion of the etch stop layer located in each opening has a double-layer structure, the portion of the etch stop layer located in each opening includes a metal layer and a metal oxide layer that are sequentially arranged in a direction away from the base; and a material of the metal layer includes metallic aluminum and/or metallic silver, and a material of the metal oxide layer includes an oxide of metallic aluminum and/or an oxide of metallic silver, and a material of the portion of the etch stop layer located outside the openings is the same as the material of the metal layer.

5. The light-emitting substrate according to claim 3, wherein
a difference between the thickness of the portion of the etch stop layer located outside the openings and the thickness of the portion of the etch stop layer located in each opening is less than 5 nm.

6. The light-emitting substrate according to claim 3, wherein the thickness of the portion of the etch stop layer located outside the openings is in a range from 0.5 nm to 50 nm.

7. The light-emitting substrate according to claim 2, wherein
the material of the first material layer includes the conductive material, the first material layer is a cathode layer, and the second material layer is an electron transport layer.

8. The light-emitting substrate according to claim 7, wherein
the etch stop layer has a single-layer structure, an absolute value of a difference between a lowest unoccupied molecular orbital (LUMO) energy level of the portion of the etch stop layer located in each opening and a Fermi level of the first material layer at a corresponding position, and an absolute value of a difference between the LUMO energy level of the portion of the etch stop layer located in each opening and a LUMO energy level of the second material layer at a corresponding position, are both less than 0.15 eV; or
the etch stop layer has a double-layer structure, the portion of the etch stop layer located in each opening includes a first surface adjacent to the first material layer and a second surface adjacent to the second material layer; an absolute value of a difference between a LUMO energy level of the first surface and a Fermi level of the first material layer at a corresponding position, and an absolute value of a difference between a LUMO energy level of the second surface and a LUMO energy level of the second material layer at a corresponding position, are both less than 0.15 eV.

9. The light-emitting substrate according to claim 2, wherein the material of the first material layer includes the carrier transport material, the first material layer is an electron transport layer, and the second material layer is a quantum dot light-emitting layer.

10. The light-emitting substrate according to claim 9, wherein
the quantum dot light-emitting layer includes i different types of light-emitting patterns, and i is an integer greater than or equal to 2.

11. The light-emitting substrate according to claim 10, wherein
the plurality of openings include i opening groups, and each opening group corresponds to light-emitting patterns of a respective type;
thicknesses of portions of the etch stop layer located in a j-th opening group are the same as thicknesses of portions of the etch stop layer located in a k-th opening group; and
j and k are each any one of 1 to i, and values of j and k are different.

12. The light-emitting substrate according to claim 7, further comprising an anode layer at a side of the first material layer away from the base, a quantum dot light-emitting layer between the anode layer and the second material layer, and a hole transport layer between the quantum dot light-emitting layer and the anode layer.

13. The light-emitting substrate according to claim 9, wherein
the etch stop layer has a single-layer structure, an absolute value of a difference between a lowest unoccupied molecular orbital (LUMO) energy level of the portion of the etch stop layer located in each opening and a LUMO energy level of the first material layer at a corresponding position, and an absolute value of a difference between the LUMO energy level of the portion of the etch stop layer located in each opening and a LUMO energy level of the second material layer at a corresponding position, are both less than 0.15 eV; or
the etch stop layer located in each opening includes a first surface adjacent to the first material layer and a second surface adjacent to the second material layer; an absolute value of a difference between a LUMO energy level of the first surface and a LUMO energy level of the first material layer at a corresponding position, and an absolute value of a difference between a LUMO energy level of the second surface and a LUMO energy level of the second material layer at a corresponding position, are both less than 0.15 eV.

14. The light-emitting substrate according to claim 9, further comprising an anode layer at a side of the first material layer away from the base, and a hole transport layer between the anode layer and the second material layer.

15. A light-emitting substrate, comprising:
a base;
a first material layer and a second material layer that are disposed on the base, the first material layer being closer to the base than the second material layer, a material of the first material layer including a conductive material or a carrier transport material, the second material layer including a plurality of patterns, and each pattern and the first material layer having an overlapping region therebetween; and
a third material layer between the first material layer and the second material layer, the third material layer including at least portions in respective overlapping regions, a portion of the third material layer located in each overlapping region being in contact with the first material layer and the second material layer, the portion of the third material layer located in each overlapping region having a double-layer structure including a metal layer and a metal oxide layer, a material of the metal layer including metallic aluminum and/or metallic silver, and a material of the metal oxide layer including an oxide of metallic aluminum and/or an oxide of metallic silver, wherein at least one energy level of the portion of the third material layer located in each overlapping region is matched with energy levels of the first material layer and the second material layer at corresponding positions.

16. A light-emitting apparatus, comprising the light-emitting substrate according to claim 1.

17. A method for manufacturing a light-emitting substrate, the method comprising:

forming a first material layer, an etch stop layer and a second material layer sequentially on a base, wherein a material of the first material layer includes a conductive material or a carrier transport material, the second material layer includes a plurality of patterns, and each pattern and the first material layer have an overlapping region therebetween; and the etch stop layer includes at least portions in respective overlapping regions, a portion of the etch stop layer located in each overlapping region is in contact with the first material layer and the second material layer at corresponding positions, and a material of the etch stop layer includes at least one of metal material, metal oxide and metal fluoride; and at least one energy level of the portion of the etch stop layer located in each overlapping region is matched with energy levels of the first material layer and the second material layer at corresponding positions.

18. The method for manufacturing the light-emitting substrate according to claim 17, wherein the second material layer includes one or i types of patterns, and i is an integer greater than or equal to 2; and forming the first material layer, the etch stop layer and the second material layer sequentially on the base, includes:

forming the first material layer and a first thin film sequentially on the base, a material of the first thin film including at least one of metallic aluminum and metallic silver, or the material of the first thin film including at least one of aluminum oxide, silver oxide, molybdenum oxide and lithium fluoride;

forming a j-th sacrificial layer and a j-th photoresist layer sequentially on the base where the first material layer and the first thin film have been formed;

forming a j-th photoresist pattern layer through exposure and development to expose portions of the j-th sacrificial layer located in a j-th region;

bombarding the portions of the j-th sacrificial layer located in the j-th region by using a plasma to remove the portions of the j-th sacrificial layer located in the j-th region;

forming a second thin film on the base where the portions of the j-th sacrificial layer located in the j-th region has been removed, the second thin film including portions in the j-th region and a portion on a surface of the j-th photoresist pattern layer away from the base; and removing a portion of the j-th sacrificial layer located outside the j-th region, together with the j-th photoresist pattern layer on the j-th sacrificial layer and a portion of the second thin film located on the surface of the j-th photoresist pattern layer away from the base, wherein in a case where the second material layer includes one type of pattern, j is equal to 1; and in a case where the second material layer includes i types of patterns, j is each of 1 to i.

19. The method for manufacturing the light-emitting substrate according to claim 18, wherein a material of the first thin film includes metallic aluminum and/or metallic silver, a working gas used in the plasma is an oxygen-containing gas, so as to form an oxide layer of metallic aluminum and/or an oxide layer of metallic silver on a surface of the first thin film located in the j-th region after removing the portions of the j-th sacrificial layer located in the j-th region.

20. The method for manufacturing the light-emitting substrate according to claim 18, wherein a working gas used in the plasma includes at least one of oxygen and argon.

* * * * *